(12) United States Patent
Koerner

(10) Patent No.: US 8,587,352 B2
(45) Date of Patent: Nov. 19, 2013

(54) FRACTIONAL-N PHASE LOCKED LOOP

(75) Inventor: Heiko Koerner, Soeding (AT)

(73) Assignee: Infineon Technologies Austria AG, Villach (AT)

( * ) Notice: Subject to any disclaimer, the term of this patent is extended or adjusted under 35 U.S.C. 154(b) by 139 days.

(21) Appl. No.: 13/235,058

(22) Filed: Sep. 16, 2011

(65) Prior Publication Data

US 2013/0069696 A1   Mar. 21, 2013

(51) Int. Cl.
*H03L 7/06* (2006.01)
(52) U.S. Cl.
USPC ........................................ 327/156; 327/147
(58) Field of Classification Search
USPC ................................................ 327/147, 156
See application file for complete search history.

(56) References Cited

U.S. PATENT DOCUMENTS

| | | | | |
|---|---|---|---|---|
| 7,110,486 B2* | 9/2006 | Adachi et al. | ................ | 375/376 |
| 7,365,607 B2* | 4/2008 | Fahim | ................ | 331/1 A |
| 2002/0061086 A1* | 5/2002 | Adachi et al. | ................ | 375/376 |
| 2011/0234272 A1* | 9/2011 | Yu | ................ | 327/157 |
| 2013/0069696 A1* | 3/2013 | Koerner | ................ | 327/117 |

* cited by examiner

*Primary Examiner* — Adam Houston
(74) *Attorney, Agent, or Firm* — Slater & Matsil, L.L.P.

(57) ABSTRACT

A frequency division circuit with a rational-valued division ratio includes a frequency divider with a selectable integer-valued division ratio supplied with an input signal of a first frequency. An output signal provides a second frequency. A first sigma-delta modulator provides a first modulated control signal representative of a first fractional number. A second sigma-delta modulator provides a second modulated control signal of a second fractional number. The integer-valued division ratio of the frequency divider is modified in accordance with the modulation of the first and the second modulated control signals.

17 Claims, 2 Drawing Sheets

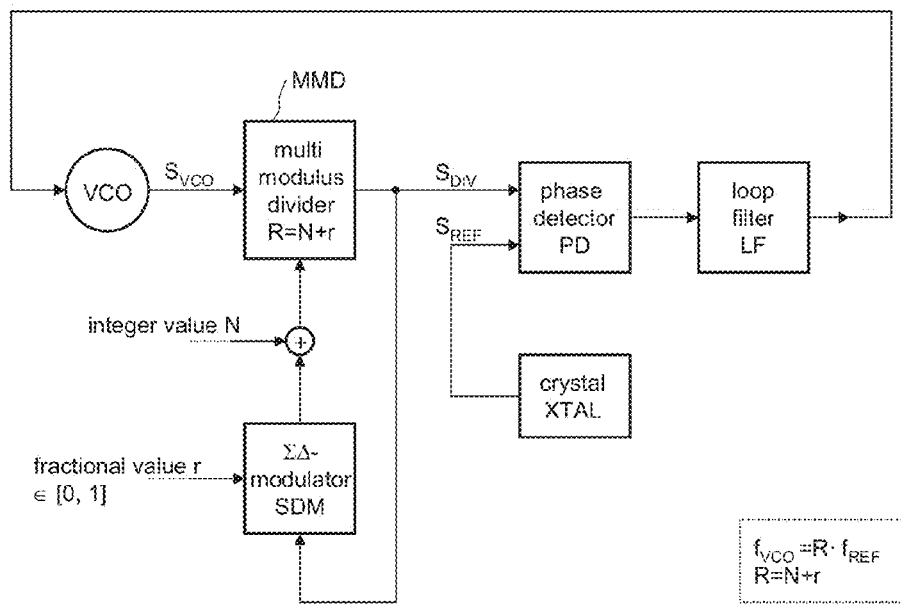
FIG. 1      conventional implementation
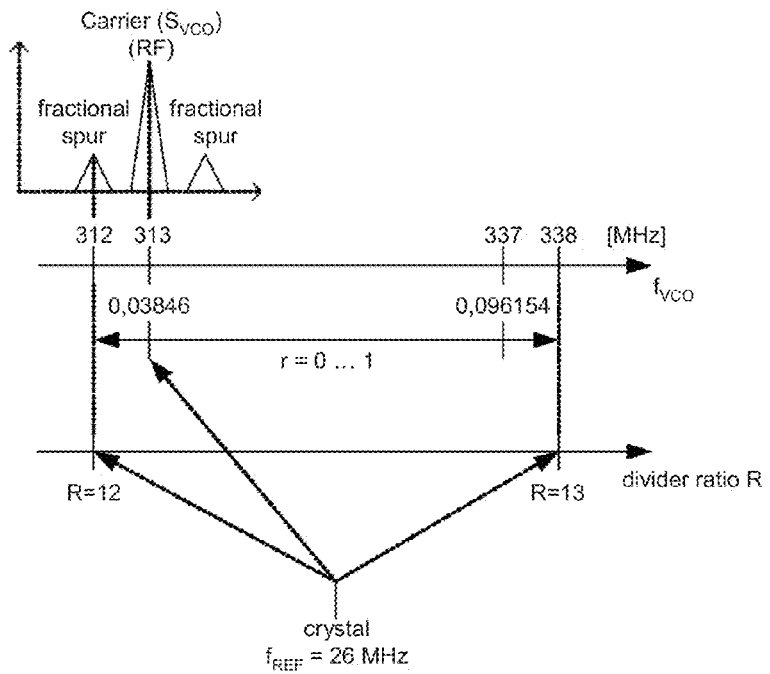
FIG. 2

FRACTIONAL-N PHASE LOCKED LOOP

TECHNICAL FIELD

The present disclosure relates to fractional-N frequency division techniques using a sigma-delta (Σ-Δ) modulator which may be applied in phase locked loops.

BACKGROUND

The use of phase-locked loops (PLL) with arbitrary frequency division (by rational division ratios N) is a well-known method for synthesizing desired frequencies. So-called fractional-N indirect digital frequency synthesis, i.e., using a PLL, is particularly well suited to integrated circuit applications. The technique allows very narrow channel spacing relative to the output frequency, large bandwidth in the PLL relative to the channel spacing, and high output frequency relative to the processing technology used in the integrated circuit. Consequently, the availability of a low-noise, low-spurious-frequency form of fractional-N division can have a significant impact on the performance of low-cost frequency synthesizers for use in consumer products.

By using fractional-N division, the wider loop bandwidth for a given channel spacing allows faster settling time and reduced phase noise requirements to be imposed on the voltage-controlled oscillator (VCO). With reduced phase noise requirements, lower cost, possibly on chip, VCO's might be used. The faster settling time, resulting from broader loop bandwidth of a PLL-based fractional-N frequency synthesis, has the potential to eliminate additional hardware typically included in a PLL to provide fast settling. Thus, a high-performance fractional-N frequency synthesizer technique may lead to a complete high-performance synthesizer on a chip.

It is known to use a Σ-Δ modulator to instantaneously alter the feedback division modulus (see, e.g. Tom A. D. Riley: Delta-Sigma Modulation in Fractional-N Frequency Synthesis, in: IEEE Journal of Solid-State Circuits, vol. 28, no. 5, May 1993). However, this typically introduces excessive phase noise and fractional spurs. The use of third order multi-stage noise-shaping modulators ($3^{rd}$ order MASH modulators) are usually able to provide high stability and sufficient noise shaping characteristics. However, particularly when the rational division ratio is close to an integer number the significant spurs (called "fractional spurs") may occur in the spectrum of the PLL output signal. Thus there is still a general need for an improved frequency division with rational division ratios (a so-called fractional-N division) providing an improved rejection of fractional spurs.

SUMMARY OF THE INVENTION

A frequency division circuit with a rational-valued division ratio is disclosed. The circuit includes a frequency divider with a selectable integer-valued division ratio being supplied with an input signal of a first frequency and providing an output signal of a second frequency. Further, the circuit includes a first sigma-delta modulator configured to provide a first modulated control signal, which is representative of a first fractional number, and a second sigma-delta modulator configured to provide a second modulated control signal, which is representative of a second fractional number. The integer-valued division ratio of the frequency divider is modified in accordance with the modulation of the first and the second control signal. Further, a corresponding method for controlling the division ratio of a frequency divider is disclosed.

Further, a phase locked loop (PLL) is disclosed. The PLL includes a voltage controlled oscillator (VCO) or a numerically controlled oscillator (NCO) configured to provide an output signal having a first frequency that is adjustable in accordance with a control input. The PLL further includes a frequency divider with a selectable integer-valued division ratio being supplied with the output signal and providing a divider output signal of a second frequency, and a phase detector receiving the divider output signal and a reference signal having a reference frequency, the phase detector being configured to compare the phase and/or the frequency of the divider output signal and the reference signal and to provide an error signal dependent on the comparison. A loop filter is configured to filter the error signal, wherein the control input of the VCO or NCO is or is derived from the filtered error signal, thus closing the loop. A first sigma-delta modulator is configured to provide a first modulated control signal which is representative of a first fractional number. Similarly, a second sigma-delta modulator is configured to provide a second modulated control signal which is representative of a second fractional number. Finally, the integer-valued division ratio of the frequency divider is modified in accordance with the modulation of the first and the second control signal.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings:

FIG. 1 illustrates a conventional PLL with a fractional-N frequency division implemented using a multi-modulus divider supplied with the output of a Σ-Δ modulator to set the division ratio;

FIG. 2 illustrates the effect of fractional spurs occurring in a PLL built in accordance with FIG. 1;

DETAILED DESCRIPTION OF ILLUSTRATIVE EMBODIMENTS

Figure 3:
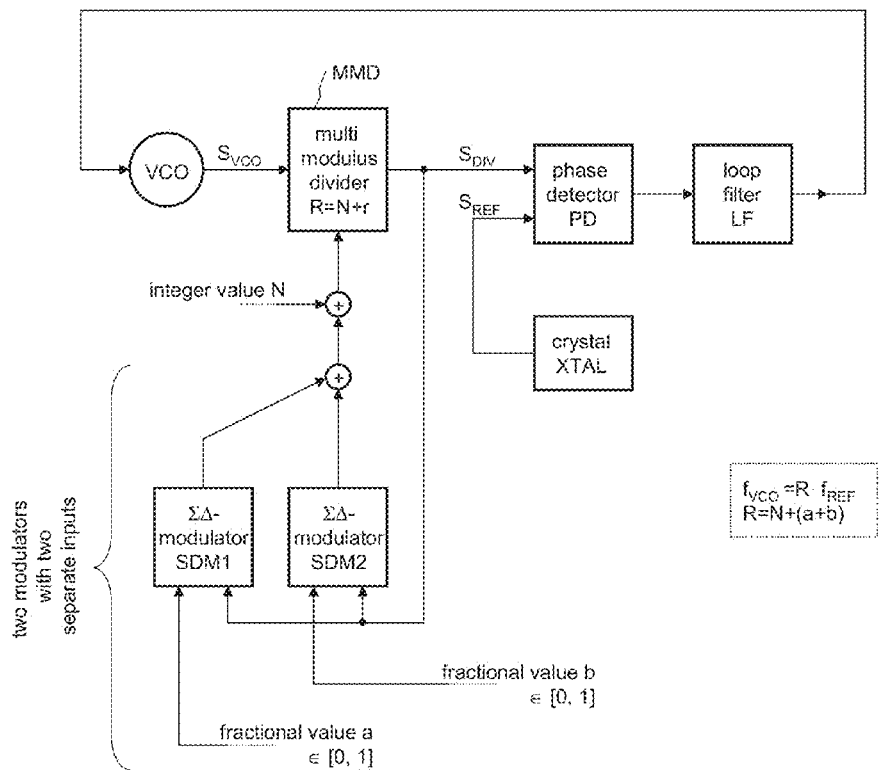
FIG. 3 illustrates, as one example of the present invention, a PLL using two Σ-Δ modulators whose outputs are combined to set the division ratio of the frequency divider.

FIG. 1 illustrates a phase locked loop (PLL) which uses a Σ-Δ modulator to instantaneously alter the feedback division modulus. The basic principle of such a PLL is commonly known and described, e.g., in Tom A. D. Riley: Delta-Sigma Modulation in Fractional-N Frequency Synthesis, in: IEEE Journal of Solid-State Circuits, vol. 28, no. 5, May 1993, which is incorporated herein by reference.

The phase locked loop includes an voltage controlled oscillator VCO (or, in a digital oscillation a numerically controlled oscillator, short: NCO) which generates an oscillating output signal $S_{VCO}$ having a frequency denoted as $f_{VCO}$ which is set in accordance with a control input of the oscillator VCO (oscillator control signal $S_{CTRL}$). The oscillating output signal $S_{VCO}$ is supplied to a frequency divider MMD having a selectable division ratio R. That is, the frequency divider MMD is configured to divide the frequency supplied to its input and to generate a divider output signal $S_{DIV}$ having a frequency denoted as $f_{DIV}$, wherein $f_{VCO}=R \cdot f_{DIV}$. The division ratio is selectable dependent on a signal supplied to a select input of the frequency divider MMD.

The divider output signal $S_{DIV}$ as well as a reference signal $S_{REF}$ having a frequency $f_{REF}$ are supplied to a phase detector PD (also known as phase comparator). Dependent on the implementation a phase-frequency-detector PFD may be employed instead. Phase detectors as well as phase-frequency detectors are commonly used in the field of PLLs. The reference signal $S_{REF}$ may be provided by a reference oscillator, which usually is (but not necessarily has to be) a crystal oscillator denoted herein as XTAL. That is, the frequency $f_{REF}$ may be determined by the resonance frequency of a quartz crystal oscillator.

The output of the phase (-frequency) detector P(F)D is filtered by a loop filter LF which determines the band-with of the control loop. The output of the loop filter is used as control signal $S_{CTRL}$ to adjust the frequency $f_{VCO}$ of the oscillator VCO thus closing the control loop. The closed loop ensures that the frequency $f_{VCO}$ is tuned to such a value that the phases of the divider output signal $S_{DIV}$ and the reference signal $S_{REF}$ match.

As mentioned above, the division ratio is determined by the $\Sigma$-$\Delta$ modulator SDM. The $\Sigma$-$\Delta$ modulator SDM is clocked by the divider output signals $f_{DIV}$ (clock frequency $f_{DIV}$). The sigma delta modulator is supplied with a (e.g., digital) input value r which represents a proper fraction between 0 and 1. For example, assuming r is a 3-bit number r can assume the following values: 0, ⅛, ¼, ⅜, ½, ⅝, ¾, and ⅞. The bit-stream at the output of the $\Sigma$-$\Delta$ modulator SDM will equals, on average, the input value r. An integer offset value N may be added to the modulator output. The average sum value R equals N+r and is then supplied to the divider MMD which sets the division ration in accordance to the sum value. That is, the divider MMD receives an updated division ratio each clock cycle of $S_{DIV}$ in accordance with the modulator output. Due to the $\Sigma$-$\Delta$ modulation the average division ratio is R=N+r, i.e., an integer ratio N augmented by a fractional value r.

It should be noted that r does not necessarily have to be a rational number between 0 and 1. Other intervals, e.g., 0 to 2 may be applicable and depend on the actual design The $\Sigma$-$\Delta$ modulator SDM and the PLL. Usually $\Sigma$-$\Delta$ modulators are used which have a 3$^{rd}$ order MASH (multi stage noise shaping) structure, also referred to as MASH3 modulator. Further, the input value r supplied to the $\Sigma$-$\Delta$ modulators does not necessarily have to cover the full range of values which theoretically would be possible. In the example of FIG. 2 r can assume any value between 0 and 1. Alternatively, the interval from 0 to 1 may be discretized such that, for example, r can vary from 0 to 25/26 in steps of 1/26. In this case, r would have to be a 5-bit number whereby only 26 of the 32 possible values are actually used.

FIG. 2 illustrates the problem of fractional spurs which may occur when using the PLL implementation of FIG. 1. In particular when the rational division ration R=N+r is close to an integer value, dominant fractional spurs may occur which have a spectrum close to the frequency $f_{VCO}$ of the VCO output signal $S_{VCO}$ (usually employed as RF carrier signal in RF applications). As a result the spurs cannot be readily suppressed by the loop filter, and there is a need for a fractional-N PLL design which prevents such fractional spurs. In the example of FIG. 2, the reference frequency $f_{REF}$ provided by the crystal oscillator XTAL is 26 MHz. The division ratio R may be varied from R=12 to R=13 and thus the VCO frequency (carrier frequency) $f_{VCO}$ may be adjusted from 312 MHz to 338 MHz. A divider ratio R of 12.03846 (N=12 and r=0.03846) yields a VCO frequency $f_{VCO}$ of 313 MHz. However, dominant fractional spurs with center frequencies at 312 and 314 MHz. occur.

FIG. 3 illustrates one example of an improved fractional-N PLL that is designed such that dominant fractional spurs, which are spectrally close to the VCO frequency $f_{VCO}$, are avoided. The phase locked loop (PLL) illustrated in FIG. 3 is substantially the same as the PLL of FIG. 1. The important difference is that two separate $\Sigma$-$\Delta$ modulators SDM1 and SDM2 are used to "encode" the fractional part of the division ratio N+r. In the present example the fractional part of the division ratio r is the sum of a and b and thus R=N+a+b, whereby the value a is a (digital) value supplied to and processed by the first $\Sigma$-$\Delta$ modulator SDM1, and the value b is a (digital) value supplied to and processed by the second $\Sigma$-$\Delta$ modulator SDM2.

Both $\Sigma$-$\Delta$ modulator SDM1, and SDM2 receive the divider output signal $S_{DIV}$ as a clock signal. The first modulator SDM1 is configured to provide an output bit-stream representing the fractional value a, whereas the second modulator SDM2 is configured to provide an output bit-stream representing the fractional value b. Both fractional values may be proper fractions between 0 and 1. However smaller and larger intervals may be applicable. The output bit-streams of the modulators are summed up. Additionally an integer offset N may be added and the sum value N+a+b is supplied to the divider MMD as in the example of FIG. 1. As a result the sum a+b may vary from 0 to 2, which may have some advantages over the example of FIG. 1 when, for example, a variation of the VCO frequency $f_{VCO}$ is desired such that r (in the example of FIG. 1) would have to be varied between, e.g., 0.99 and 1.01. As r is actually limited to a maximum value smaller than 1, in this case the integer factor N would have to toggle by 1, which may be difficult in actual implementations. Such an "overflow" of r may particularly occur when a high dynamic frequency range has to be covered, e.g., when performing FSK (frequency shift keying) modulation. A range from 0 to ab+=2 provides more flexibility and reduces the frequency of required changes of the integer factor N.

Due to the $\Sigma$-$\Delta$ modulation the average of the output of the first modulator SDM1 equals a, the average of the output of the second modulator SDM2 equals b, and the average division ratio equals N+a+b. It should be noted that a and b should not be equal so as to ensure a good suppression of fractional spurs.

Figure 4:
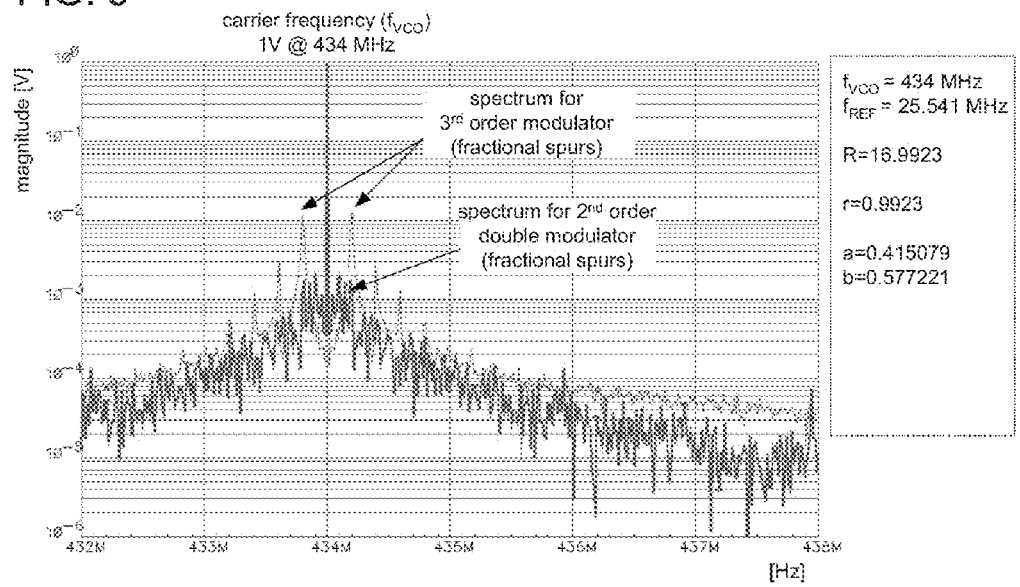
FIG. 4 is a diagram illustrating the magnitude spectra of the PLL output signals of the exemplary PLLs of FIGS. 1 and 3.

In the present example two 2$^{nd}$ order MASH (MASH2) modulators have been used (whereas in the example includes one 3$^{rd}$ order MASH modulator). The resulting spectra of the carrier signal (VCO output signal) $S_{VCO}$ are compared in the diagram of FIG. 4. It can be seen that both spectra have their main peak at $f_{VCO}$=434 MHz. The spectrum of the carrier signal $S_{VCO}$ includes two strong fractional spurs at about 433.8 MHz and 434.2 MHz when the conventional PLL of FIG. 1 is employed with one MASH3 modulator. The magnitude of these spurs is highly reduced (from about 11 mV to under 2 mV peak value) in the second spectrum of FIG. 4 which is the resulting spectrum when using the improved PLL of FIG. 3 with two MASH2 modulators. The improvement corresponds to a reduction of the spurs of 14.8 dB.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those where not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. A frequency division circuit with a rational-valued division ratio, the circuit comprising:
   a frequency divider with a selectable integer-valued division ratio configured to be supplied with an input signal of a first frequency and to provide an output signal of a second frequency;
   a first sigma-delta modulator configured to provide a first modulated control signal representative of a first fractional number; and
   a second sigma-delta modulator configured to provide a second modulated control signal representative of a second fractional number,
   wherein the integer-valued division ratio of the frequency divider is modified in accordance with the modulation of the first and the second modulated control signals.

2. The circuit of claim 1, further comprising an adder configured to add the first modulated control signal and the second modulated control signal to provide a sum signal according to which the division ratio of the frequency divider is set.

3. The circuit of claim 2, wherein the adder is further configured to add an integer valued offset signal.

4. The circuit of claim 1, wherein the first and the second sigma-delta modulators are second order MASH modulators.

5. The circuit of claim 1, wherein the first fractional number is not equal to the second fractional number.

6. A phase locked loop (PLL), comprising:
   an oscillator configured to provide an output signal having a first frequency that is adjustable in accordance with a control input, wherein the oscillator comprises a voltage controlled oscillator (VCO) or a numerically controlled oscillator (NCO);
   a frequency divider with a selectable integer-valued division ratio configured to be supplied with the output signal and to provide a divider output signal of a second frequency;
   a phase detector coupled to receive the divider output signal and a reference signal having a reference frequency, the phase detector being configured to compare a phase and/or a frequency of the divider output signal and the reference signal and to provide an error signal dependent on the comparison;
   a loop filter configured to filter the error signal, wherein the control input of the oscillator is or is derived from the filtered error signal, thus closing the loop;
   a first sigma-delta modulator configured to provide a first modulated control signal representative of a first fractional number; and
   a second sigma-delta modulator configured to provide a second modulated control signal representative of a second fractional number, wherein the integer-valued division ratio of the frequency divider is modified in accordance with modulation of the first and the second control signals.

7. The PLL of claim 6, further comprising an adder configured to add the first and the second modulated control signal to provide a sum signal according to which the division ratio of the frequency divider is set.

8. The PLL of claim 7, wherein the adder is further configured to add an integer-valued offset signal.

9. The PLL of claim 6, wherein the first and the second sigma-delta modulators are second order MASH modulators.

10. The PLL of claim 6, wherein the first fractional number is not equal to the second fractional number.

11. A method for controlling a division ratio of a frequency divider that has a selectable integer-valued division ratio, is supplied with an input signal of a first frequency and provides an output signal of a second frequency; the method comprising:
    generating a first sigma-delta modulated control signal representative of a first fractional number;
    generating a second sigma-delta modulated control signal representative of a second fractional number; and
    modifying the integer-valued division ratio of the frequency divider in accordance with the modulation of the first and the second control signals.

12. The method of claim 11, further comprising adding the first and the second modulated control signals to provide a sum signal according to which the division ratio of the frequency divider is set.

13. The method of claim 12, wherein the adding further comprises adding an integer-valued offset signal.

14. The method of claim 11, wherein the first and the second sigma-delta modulated control signals are generated using a second order MASH modulation technique.

15. The method of claim 11, wherein the first fractional number is not equal to the second fractional number.

16. A frequency division circuit with a rational-valued division ratio, the circuit comprising:
    a frequency divider with a selectable integer-valued division ratio configured to be supplied with an input signal of a first frequency and to provide an output signal of a second frequency;
    a first sigma-delta modulator configured to provide a first modulated control signal;
    a second sigma-delta modulator configured to provide a second modulated control signal; and
    an adder configured to add the first modulated control signal and the second modulated control signal to provide a sum signal according to which the division ratio of the frequency divider is set, wherein the integer-valued division ratio of the frequency divider is modified in accordance with the modulation of the first and the second modulated control signals.

17. A frequency division circuit with a rational-valued division ratio, the circuit comprising:
    a frequency divider with a selectable integer-valued division ratio configured to be supplied with an input signal of a first frequency and to provide an output signal of a second frequency;
    a first sigma-delta modulator configured to provide a first modulated control signal; and
    a second sigma-delta modulator configured to provide a second modulated control signal, wherein the integer-valued division ratio of the frequency divider is modified in accordance with the modulation of the first and the second modulated control signals, and the first and the second sigma-delta modulators are second order MASH modulators.

* * * * *